United States Patent [19]

Eshita

[11] Patent Number: 4,997,787
[45] Date of Patent: Mar. 5, 1991

[54] METHOD FOR FABRICATING A SEMICONDUCTOR FILM WHICH IS ELECTRICALLY ISOLATED FROM A SUBSTRATE

[75] Inventor: Takashi Eshita, Inagi, Japan

[73] Assignee: Fujitsu Limited, Kawasaki, Japan

[21] Appl. No.: 446,801

[22] Filed: Dec. 6, 1989

[30] Foreign Application Priority Data

Dec. 6, 1988 [JP] Japan .................. 63-309070

[51] Int. Cl.⁵ .................. H01L 21/302; H01L 21/20
[52] U.S. Cl. ...................... 437/62; 437/100; 437/947; 148/DIG. 135
[58] Field of Search .............. 148/DIG. 135; 437/100, 437/62, 947

[56] References Cited

U.S. PATENT DOCUMENTS

| | | | |
|---|---|---|---|
| 3,901,745 | 8/1975 | Pion | 437/974 |
| 4,142,925 | 3/1979 | King et al. | 158/DIG. 135 |
| 4,512,825 | 4/1985 | Addamiano et al. | 437/100 |
| 4,891,329 | 1/1990 | Reisman et al. | 148/DIG. 135 |

OTHER PUBLICATIONS

J. J. Cuomo and R. F. Rutz, *IBM Tech. Disc. Bul.* "Growing Silicon Carbide and Aluminum Nitride Crystals", vol. 17, No. 9, Feb. 1975, p. 2817.

Primary Examiner—Brian E. Hearn
Assistant Examiner—Laura M. Holtzman
Attorney, Agent, or Firm—Staas & Halsey

[57] ABSTRACT

A method for fabricating a crystal imperfection free silicon carbide (SiC) film electrically insulated from silicon substrate. A SiC film is heteroepitaxially grown over a silicon substrate, and set into a jig made of Teflon. The jig holds the substrate by its periphery, and exposes the bottom surface of the substrate which is opposite to the SiC film. The semiconductor substrate is etched off from its bottom side, and the lower surface of the SiC film is exposed. Silicon dioxide film is deposited to the lower surface of the SiC film and a second silicon substrate is adhered to the silicon dioxide film by applying pulse voltage. The surface of the SiC film fabricated in this way is never contacted to the silicon substrate, therefore, it is free from the crystal imperfections which occurs close to the contact surface to the silicon substrate. Accordingly, the SiC film formed in such a way is desirable for fabricating semiconductor devices.

14 Claims, 3 Drawing Sheets

METHOD FOR FABRICATING A SEMICONDUCTOR FILM WHICH IS ELECTRICALLY ISOLATED FROM A SUBSTRATE

BACKGROUND OF THE INVENTION

1. Field of the Invention

The present invention relates to a method for forming a semiconductor film to fabricate semiconductor devices therein, more precisely, it relates to a method for forming an epitaxially grown semiconductor film which is electrically isolated from a supporting substrate.

2. Description of the Related Art

Recently, requests for semiconductor devices which can be used under severe condition of high temperature or high radioactivity are increasing. Such requests are especially strong from industry of space equipments, atomic reactor, engine control and so on. Silicon carbide (SiC) is considered to be a desirable semiconductor material for fabricating devices applied for such use. It is known that silicon loses the property of semiconductor at about 200° C., while silicon carbide maintains its semiconductor property up to more than 600° C. SiC has a superior durability for radioactivity compared to ordinary semiconductor materials.

Silicon carbide, however, is difficult to grow a large single crystal ingot. Therefore, it is heteroepitaxially grown on a substrate such as silicon. The heteroepitaxially grown SiC is necessary to be isolated from the substrate in order to make a semiconductor devices. The isolation is especially important for fabricating a planer type devices, such as field effect transistors (FET).

The isolation of heteroepitaxially grown silicon carbide from a substrate is usually done as follows. FIG. 1 schematically shows a conventional structure of SiC substrate. A non-doped SiC 2 of 3–6 μm thick is grown on a silicon substrate 1, and a SiC layer 3 of desired conductivity type is grown on the non-doped SiC layer 2. The SiC layer 3 is insulated from the silicon substrate 1 by the non-doped SiC layer 2, which has a very high resistivity. This method, however, has some faults. First, it takes a very long time to grow the thick non-doped SiC layer 2. Further, the resistivity of the non-doped SiC decreases when temperature becomes higher than 300° C. So, the important characteristics of silicon carbide device that it can be operated at high temperature is lost. Further detail of such device is given in "LOW-TEMPERATURE HETEROEPITAXY OF β-SiC ON Si (111) SUBSTRATES" by T. Eshita et al, Mat. Res. Soc. Symp/Proc. Vol. 116, 1988, Materials Research Society.

Another method to isolate a SiC layer from its silicon substrate is to use a pn junction of SiC as shown in FIG. 2. An n type SiC layer 4, and a p type SiC layer 5 are subsequently grown over a silicon substrate 1. By the pn junction formed between the two SiC layers 4 and 5, the upper SiC layer 5 is isolated from the substrate 1. But since the isolation effect by pn junction is lost over a temperature of 300° C., this method also can be used for fabricating a device operable in high temperature.

FIG. 3 shows still another method of isolation. In this method, a SiC layer 6 and a silicon dioxide (SiO₂) layer 7 are grown successively over a silicon substrate 1, as shown in FIG. 3(a). A second Si substrate 1' is prepared, and a SiO₂ 7' is formed on it by thermal oxidation, as shown in FIG. 3(b). These substrates are stacked facing the SiO₂ layers 7 and 7' to each other, and a pulse voltage is applied between the both substrates 1 and 1', as shown in FIG. 3(c). By this process, the two SiO₂ layers 7 and 7' adhere to each other and become a single SiO₂ layer 7. Then, the upper SiO₂ substrate 1 is removed by etching or polishing as shown in FIG. 3(d).

By the above method of FIG. 3, the SiC layer 6 is isolated by the SiO₂ layer 7. Accordingly, the isolation of the SiC layer from the second substrate 1' is maintained up to very high temperature. But there is still one defect in this method. It will be noticed that, the upper surface 8 of the SiC layer 6 in FIG. 3(d) is the surface which was directly contacted to the removed Si substrate 1 (see FIG. 3(a)). The heteroepitaxially grown SiC crystal, however, includes plenty of crystal imperfections at a portion close to the substrate. Therefore, the portion of the SiC layer 6 close to its upper surface 8 has plenty of crystal imperfections, such as dislocations. Accordingly, it is difficult to obtain a good electrical characteristics of the devices when they are formed in such SiC layer, and yield of the device fabrication decreases.

It is known that the density of crystal imperfections decreases rapidly when the position in the crystal is shifted from the interface between the newly grown crystal and the substrate. For example in a SiC crystal heteroepitaxially grown on a silicon substrate, the density of crystal imperfection is about $1 \times 10^{10}/cm^2$ at a portion 0.2 μm apart from the surface of the substrate, but it reduces to about $10^8/cm^2$ at a portion 1 μm apart from the boundary surface. Accordingly, if it is possible to use a crystal which is grown slightly apart from the surface which was contacted to the substrate when the crystal was grown, the problem of crystal imperfection is largely traversed.

SUMMARY OF THE INVENTION

The object of the present invention, therefore, is to provide a method for fabricating a silicon carbide layer which is isolated from substrate, of which isolation is maintained at more than 400° C.

Another object of the present invention is to provide a method for forming a silicon carbide layer isolated from its substrate, said silicon carbide layer being free of crystal imperfection at a portion for fabricating semiconductor devices.

Further object of the present invention is to provide a silicon carbide layer for fabricating semiconductor devices which can operate at a temperature higher than 400° C.

Still another object of the present invention is to provide a method for fabricating a semiconductor layer which is difficult to make a large single crystal on an isolated substrate.

Such objects are attained by, growing a SiC layer over a substrate, etching off the substrate from its bottom surface which is opposite to the SiC layer, growing an insulation layer on the bottom surface of the SiC layer which was contacted to the etched off substrate, and adhering a second substrate to the insulation layer.

According to the present invention, a first silicon substrate of about 500 μm thick is prepared. A SiC layer of desired conductivity type is heteroepitaxially grown to a desired thickness over the first silicon substrate. The substrate is held by a jig, and the first silicon substrate is etched off from the side opposite to the SiC layer. By this etching, the lower surface of the SiC layer which was contacted to the first substrate is exposed, remaining the peripheral portion of the silicon substrate. The remained peripheral portion of the silicon substrate becomes a guard ring which supports the very thin SiC layer. Then, a silicon dioxide (SiO$_2$) layer of sufficient thickness is grown on the lower surface of the SiC layer by chemical vapor deposition (CVD). A second silicon substrate is prepared and the SiC layer is stacked on it facing the SiO$_2$ layer to the second silicon substrate. The SiC layer and the second silicon substrate are adhered to each other by applying a pulse voltage.

By such a method, the portion of the SiC layer which was formed close to the first silicon substrate (which is already etched off), and including crystal imperfections, is put to the deep portion from the surface of the SiC layer. And the upper surface of the SiC layer which was grown apart from the first silicon substrate is exposed on the upper surface of the adhered substrate. Therefore, the portion close to the upper surface of the SiC layer is free from crystal imperfection, so, it is desirable for forming semiconductor devices therein.

Such method for forming a semiconductor film is not limited its application to SiC layer, but it can be applied to any other semiconductor materials. It is especially effective to apply to form a substrate of material which is difficult to make a large single crystal ingot, such as III-V and II-VI group compound semiconductor.

Other objects and advantages of the present invention, will become apparent from the following description, the appending claims and the accompanying drawings.

BRIEF DESCRIPTION OF THE DRAWINGS

FIG. 3 shows schematically a structure and steps to fabricate a semiconductor substrate by still another prior art method, of which SiC layer is insulated from the substrate by a silicon dioxide film, wherein:

FIG. 5 schematically illustrates a steps for fabricating a semiconductor substrate by the present invention, wherein:

Throughout the drawings, same or similar reference numerals designate and identify the same or corresponding parts.

DESCRIPTION OF THE PREFERRED EMBODIMENTS

Figure 1:
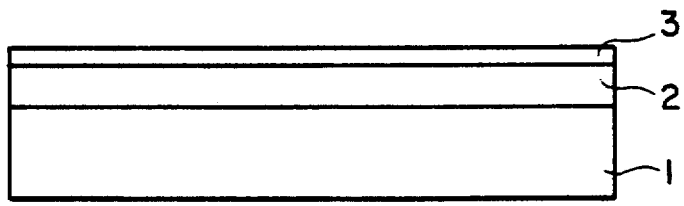
FIG. 1 is a schematic cross section of a prior art semiconductor substrate, of which SiC layer is insulated from the substrate by an non-doped SiC layer.
Figure 2:
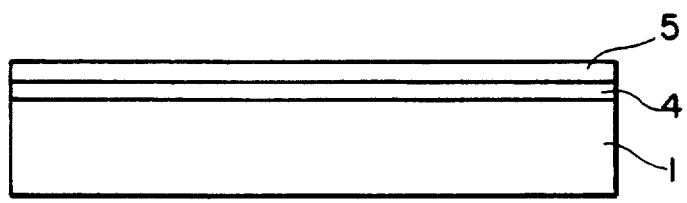
FIG. 2 is a schematic cross section of another prior art semiconductor substrate, of which SiC layer is insulated from the substrate by a pn junction.
Figure 4:
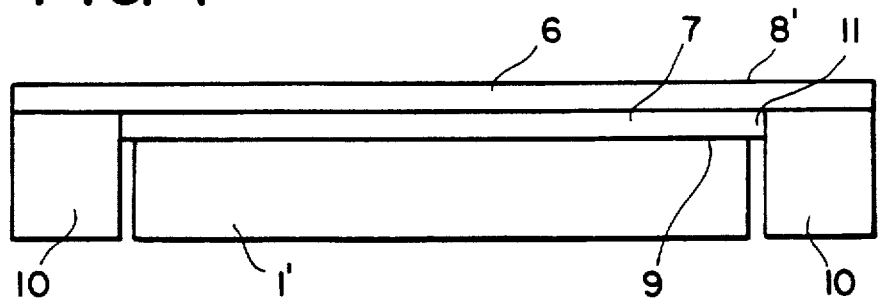
FIG. 4 schematically shows a cross section of the fundamental structure of a substrate formed by the present invention.
Figure 3A:
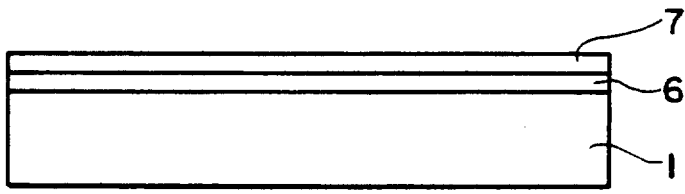
FIG. 3(a) shows an SiC layer grown a first Si substrate, and is covered by a SiO$_2$ layer.
Figure 3B:
FIG. 3(b) shows a second silicon substrate on which a SiO$_2$ layer is formed.
Figure 3C:
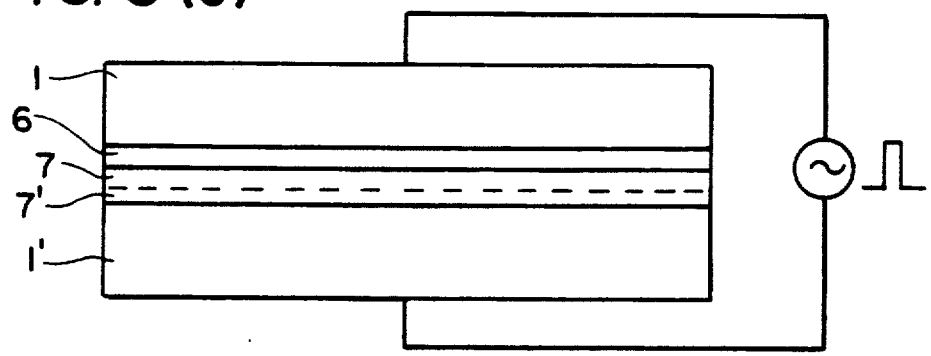
FIG. 3(c) shows schematically, how the two substrates are adhered to each other by applying a pulse voltage.
Figure 3D:
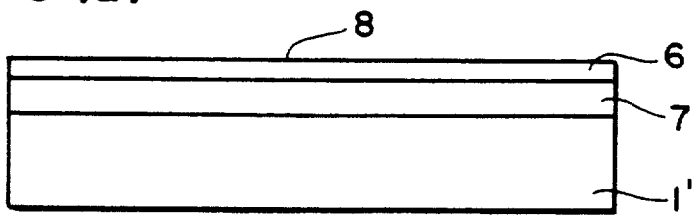
FIG. 3(d) shows a state, when the first silicon substrate is etched off and SiC layer is exposed.

FIG. 4 is a schematic cross section illustrating a fundamental structure of a substrate fabricated by the present invention. The SiC layer 6 is isolated from a silicon substrate 1' by a silicon dioxide layer 7. Therefore, the isolation of the SiC layer 6 is stable up to more than 1,000° C. Such configuration of the substrate looks similar to that of FIG. 3(d). But there are distinct difference between these two substrates.

Firstly, the upper surface 8' of the SiC layer 6 of the present invention is a surface which is did not contact to the silicon substrate on which the SiC layer 6 has been grown. Namely, as will be described later, the growth of SiC is started from the lower surface 9 of the SiC layer 6, therefore, the upper surface 8' is a surface which is grown most lately in the heteroepitaxial growing process of the SiC layer 6. Accordingly, the crystal imperfections, which occurs due to mismatch of lattice constant between the substrate and the grown crystal, concentrate mostly to a portion close to the lower surface 9 of the SiC layer. And the upper portion of the SiC layer 6 which is apart from the lower surface 9 of the SiC layer 6 is almost free form these crystal imperfections. This is the most important advantage of the present invention compared to the prior art substrate of FIG. 3(d), which has may crystal imperfections at the upper portion of the crystal close to the upper surface 8 of the SiC layer 6. Therefore, the SiC substrate of the present invention is desirable for fabricating various semiconductor devices compared to any of the prior art substrate.

Secondly, as can be seen in FIG. 4, the substrate is supported on its periphery by a guard ring 10. Accordingly, the substrate is very easy to handle in various semiconductor processes. Without such guard ring, the substrate is too thin and fragile to handle. The peripheral portion of the SiC layer 6 over the guard ring 10 is not used as a device area for fabricating semiconductor devices in it, because this portion is not isolated by the silicon dioxide layer 7. But such peripheral portion is very useful for the semiconductor manufacturing process. For example, various marks are necessary for mask aligning in semiconductor device manufacturing processes. Such marks are formed on this peripheral portion over the guard ring 10, while the semiconductor devices are formed in the central portion where the SiC layer 6 is isolated from the silicon substrate 1' by the silicon dioxide layer 7.

After all of the processes for fabricating the devices in the SiC substrate are finished, the guard ring 10 can be easily removed by etching or merely braking the narrow gap portion 11 between the central portion of the substrate and the guard ring 10. The braking is easily done by simply pushing down the guard ring 10 against the silicon substrate 1'. The central portion of the SiC layer is never harmed by such braking, since the thickness of the SiC layer 6 and the SiO$_2$ layer 7 is very thin, approximately 1–2 μm for example, the gap portion is very narrow approximately less than 1 mm, and the SiC layer is tightly adhered on the silicon substrate 1.

Figure 5A:
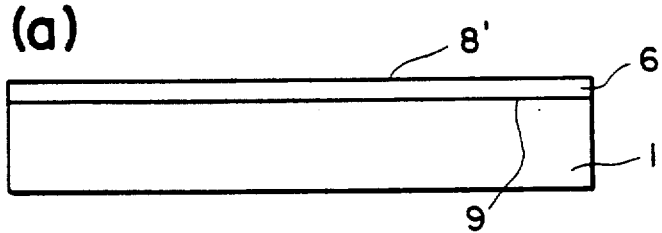
FIG. 5(a) shows a cross section of a state, when a SiC layer is formed over a first silicon substrate.

Next, how such SiC substrate is fabricated by the present invention will be described. First, a first silicon substrate 1 of 500 μm thick and 10 cm in diameter for example is prepared. And as shown in FIG. 5(a), a SiC layer 6 having a desired conductivity type, and 3,000 A°-1 μm thick for example is heteroepitaxially grown by a chemical vapor deposition (CVD). The conductivity type and the resistivity of the grown SiC layer 6 is controlled by adjusting the contents of $PH_3$, $B_2H_6$, $Al(CH_3)$ etc. which are supplied during the CVD process. Such process is a conventional one, and since is not explicitly relevant to the present invention, further description is omitted for the sake of simplicity. Further description can be found for example in the literature of Eshita et al, which has been referred before, or "Heteroepitaxial β-SiC on Si" by Y. Furumura et al, pp. 1255-1260, Solid-state Science and Technology, May 1988. Jour. Electrochem. Soc.

It should be noted that since the SiC layer 6 is grown on the first silicon substrate 1, the portion close to the lower surface 9 which is contacted to the first silicon substrate 1 has many crystal imperfections, while the upper portion of the SiC layer 6 which is close to the upper surface 8' is free from these crystal imperfections.

Figure 5B:
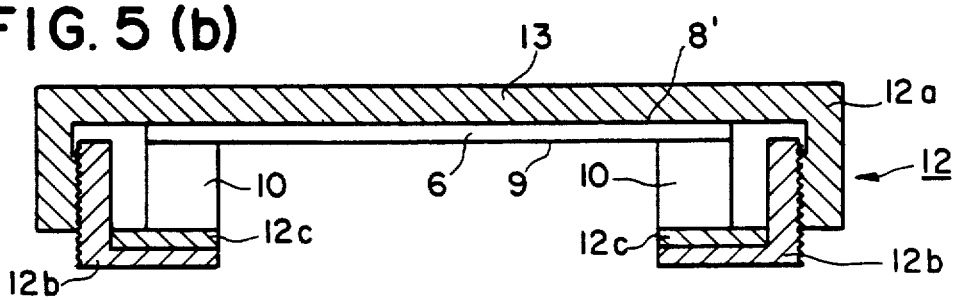
FIG. 5(b) shows a state, when the substrate is supported by a jig, and the first silicon substrate is etched off from its bottom surface, and the bottom surface of SiC layer is exposed.

Such a substrate as shown in FIG. 5(a) is set into a jig 12 as shown in FIG. 5(b). FIG. 5(b) is a schematic cross section of the jig which is holding the substrate. The jig 12 is made of Teflon (polytetrafluoroethylene) resin and composed of a cap 12a, a bottom screw 12b and a mask ring 12c. The cap 12a is shaped like a flat bottomed shallow cylinder having a diameter, which is enough to hold the substrate in it. The height of the cap is 10 mm, the outer diameter is 12 cm, the inner diameter is 11 cm for example. And the flat bottom 13 of the cap is about 5 mm thick. The inner surface of the cap cylinder 12a is provided with a screw, to which the bottom screw 12b is engaged. The bottom screw 12b is also shaped like a flat bottomed shallow cylinder about 10 mm high. At the center of the flat bottom of the bottom screw 12b is provided a hole. The thickness of the bottom of the bottom screw is about 8 mm, and the diameter of the hole is about 8 cm for example. Therefore, the cross section of the bottom screw 12b is L shaped as shown in FIG. 5(b). The mask ring 12c is a washer of about 3 mm thick, its outer and inner diameters are respectively equal to the inner diameter of the bottom screw 12b, and the diameter of the hole in the bottom screw.

The substrate is held by the jig 12 facing the upper surface 8' of the SiC layer 6 to the inner bottom surface of the cap 12a, and pressed to it by the bottom screw 12b and the mask ring 12c, as shown in FIG. 5(b). When the substrate is held in the jig 12, the peripheral portion of the first silicon substrate 1 is masked by the mask ring 12c, and the surface of the substrate is sealed off from the ambient, except the bottom surface of the fist silicon substrate 1 exposed from the hole of the mask ring 12c.

Then the jig caring the substrate is immersed into an etchant, and the first silicon substrate 1 is etched from its bottom surface until the lower surface 9 of the SiC layer 6 is exposed. FIG. 5(b) shows the state, when the first silicon substrate 1 is etched off leaving its peripheral portion which is covered by the mask ring 12c. For the etchant of this etching process, a mixture of hydrofluoric acid (HF), nitric acid ($HNO_3$) and acetic acid ($CH_3COOH$) is effective.

Figure 5C:
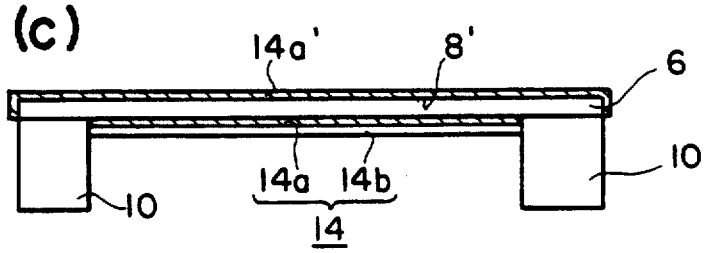
FIG. 5(c) shows a state when a SiO$_2$ layer is deposited on the bottom surface of the SiC layer, and the substrate is taken out from the jig.

When the jig 12 is taken off, the peripheral portion of the first silicon substrate 1 is remained and becomes the guard ring 10. Then, the lower surface 9 of the SiC layer 6 is covered by a silicon dioxide layer. It is desirable to form a first $SiO_2$ layer 14a of 500-5,000 A° thick over the entire surface of the substrate by thermal oxidation, and then deposit a second $SiO_2$ layer 14b of 1-3 μm thick on the bottom side of the first silicon substrate 1 by CVD. The growing of the second $SiO_2$ layer 14b can be done by any other method such as a plasma gas deposition method for example. By doing so, the $SiO_2$ layer 14 is tightly formed on the lower surface of the SiC layer 6 as shown in FIG. 5(c). The $SiO_2$ layer 14a' over the upper surface 8' of the SiC layer 6 may be removed at this stage, but it is better to leave it unremoved for protection of the SiC layer 6, until a device is formed in the SiC layer by later process. But in the figures of the following steps of FIGS. 5(d) and 5(e), the upper $SiO_2$ 14a' is omitted for the sake of simplicity.

Figure 5D:
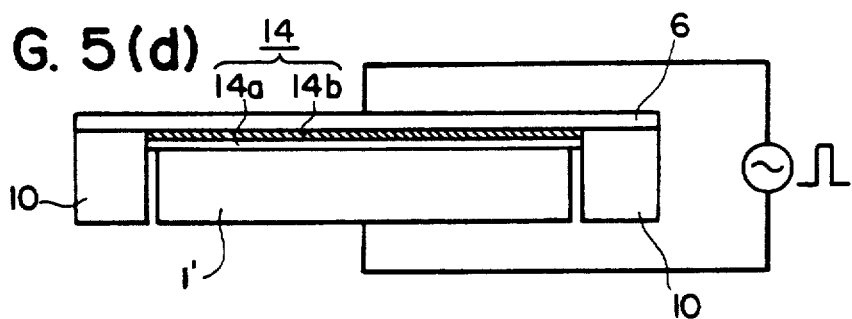
FIG. 5(d) schematically illustrate, when the substrate is placed on a second silicon substrate and adhered to it by applying a pulse voltage.

A second silicon substrate 1' of about 500 μm thick and having a diameter slightly smaller than that of the inner diameter of the guard ring 10 is prepared. The substrate of FIG. 5(c) is stacked on the second substrate 1' contacting the $SiO_2$ layer 14 to the second silicon substrate 1'. And a pulse voltage of about 600 volts, width 200 ms, pulse interval 500 ms, is applied between the SiC layer 6 and the second silicon substrate 1', as shown in FIG. 5(d), for about 30 minutes under a temperature of 600-900° C. By this process the second silicon substrate 1' is adhered to the SiC substrate 6 intermediated by the silicon dioxide layer 14. After the adherence process, the substrate was annealed for about 30 min. at about 1,100° C. Such adherence process is now common in the art, so, further description is omitted. But further detail is given for example in "Soft Error Rate of 64 K SOI-DRAM" by H. Gotou et al, 870 IEDM 87, IEEE, 1987. Thus, a SiC substrate as shown in FIG. 4 is completed.

Figure 5E:
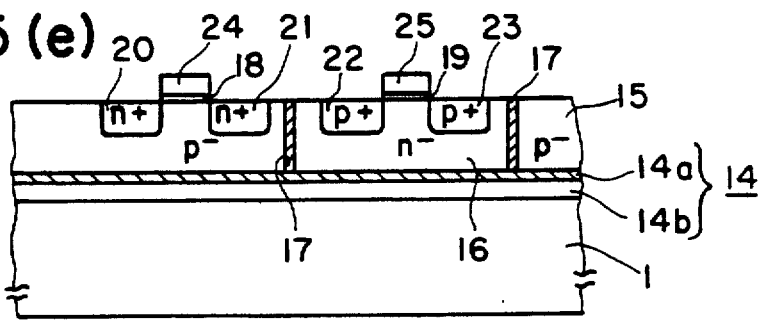
FIG. 5(e) schematically shows a cross section of a state, when a complementary FET is formed in the SiC substrate.

As an application of the SiC substrate, which is fabricated by the present invention is shown in FIG. 5(e). The figure shows schematically a cross section of a complementary FETs fabricated in an SiC layer 15 of the present invention. An n type well 16 is formed in a p type SiC layer 15 which is fabricated by the method of the present invention. The n type well 16 is isolated from the p type substrate 15 by a $SiO_2$ layers 17. 18 and 19 are gate oxide layers formed on respective position of n channel and p channel FETs. 20, 21 and 22, 23 are respectively source, drain regions of the n channel and p channel FETs, and 24, 25 are respectively the gate electrode formed on the gate oxide layers. These structure are quite conventional ones, and a method for fabricating them are also conventional ones. So, further description is omitted, because FIG. 5(e) is but an example of application, and is not explicitly relevant to the present invention.

FETs fabricated using a SiC substrate which is formed by the present invention could operate well up to more than 400° C. Such a device could never made using any SiC substrate fabricated by prior art method.

The disclosure has been provided with respect to an application for fabricating a SiC layer on an isolated silicon substrate. But it will be apparent for the one skilled in the art that the method can be applied to form a film of other materials which are difficult to make a large crystal, such as gallium arsenide and III-V or II-VI compounds, on an isolated substrate. Although only one embodiment of the invention has been disclosed and described, it is apparent that other embodiments and modification of the invention are possible, without departing from the spirit or essential characteristics thereof. For example, the silicon dioxide layer intermediating the adhesion of the second silicon substrate and the SiC layer can be formed on the second silicon substrate, the substrate which supports the SiC layer may be replaced by some other material such as polysilicon, and the material and form of the jig holding the substrate for etching off the first substrate may be replaced by any other form or material.

The presently disclosed embodiment is, therefore, to be considered in all respects as illustrative and not restrictive. All changes which come within the meaning and range of equivalence of the claims are, therefore, to be embraced therein.

What is claimed is as follows:

1. A method for fabricating a semiconductor film which is electrically isolated from a semiconductor substrate which supports said semiconductor film, said method comprising the steps of:
   (a) preparing a first semiconductor substrate;
   (b) heteroepitaxially growing said semiconductor film over said first semiconductor substrate;
   (c) etching off said first semiconductor substrate from the side of said first semiconductor substrate until lower surface of said semiconductor film is exposed,
   wherein said lower surface is in contact with said first semiconductor substrate until said first semiconductor substrate has been etched off;
   (d) forming an insulation film over the lower surface of said semiconductor film;
   (e) preparing a second semiconductor substrate; and
   (f) adhering said second semiconductor substrate to said semiconductor film intermediating said insulation film.

2. A method for fabricating a semiconductor film as recited in claim 1, wherein:
   said semiconductor film is a silicon carbide (SiC) film.

3. A method for fabricating a semiconductor film as recited in claim 1 wherein:
   said first and second semiconductor substrates are silicon substrates.

4. A method for fabricating a semiconductor film as recited in claim 1 wherein:
   said insulation film is a silicon dioxide (SiO$_2$) film.

5. A method for fabricating a semiconductor film as recited in claim 1 wherein:
   said process (c) comprises the steps of:
   (c1) setting the substrate which is processed by said process (b) into a jig which holds said substrate by peripheral portion, and exposes only bottom side of said first semiconductor substrate,
   wherein said bottom side means the surface which is opposite to the side which is contacting to said semiconductor film; and
   (c2) immersing said jig which is holding said substrate into an etchant.

6. A method for fabricating a semiconductor film as recited in claim 1 wherein:
   said process (d) comprises the steps in succession:

(d1) oxidizing lower surface of said semiconductor film by a thermal oxidation process; and
   (d2) depositing silicon dioxide film by a vapor phase deposition process.

7. A method for fabricating a semiconductor film as recited in claim 6, wherein:
   said process (d2) comprises one of the processes of chemical vapor deposition process, or plasma gas deposition process.

8. A method for fabricating a semiconductor film as recited in claim 1 wherein:
   said process (f) comprises the steps of:
   (f1) stacking said second semiconductor substrate, and said semiconductor film processed by the process (d) facing said insulation film and said second semiconductor substrate to each other; and
   (f2) applying pulse voltage between said semiconductor film and said second semiconductor substrate.

9. A method for fabricating a semiconductor film as recited in claim 2, wherein:
   said first and second semiconductor substrates are silicon substrates.

10. A method for fabricating a semiconductor film as recited in claim 2, wherein:
    said insulation film is a silicon dioxide (SiO$_2$) film.

11. A method for fabricating a semiconductor film as recited in claim 2, wherein:
    process (c) comprises the steps of:
    (c1) setting the substrate which is processed by said process (b) into a jig which holds said substrate by peripheral portion, and exposes only bottom side of said first semiconductor substrate,
    wherein said bottom side means the surface which is opposite to the side which is contacting to said semiconductor film; and
    (c2) immersing said jig which is holding said substrate into an etchant.

12. A method for fabricating a semiconductor film as recited in claim 2, wherein:
    said process (d) comprises the steps in succession:
    (d1) oxidizing lower surface of said semiconductor film by a thermal oxidation process; and
    (d2) depositing silicon dioxide film by a vapor phase deposition process.

13. A method for fabricating a semiconductor film as recited in claim 12, wherein:
    said process (d2) comprises one of the processes of chemical vapor deposition process, or plasma gas deposition process.

14. A method for fabricating a semiconductor film as recited in claim 2, wherein:
    said process (f) comprises the steps of:
    (f1) stacking said second semiconductor substrate, and said semiconductor film processed by the process (d) facing said insulation film and said second semiconductor substrate to each other; and
    (f2) applying pulse voltage between said semiconductor film and said second semiconductor substrate.

* * * * *